(12) United States Patent
Choy et al.

(10) Patent No.: US 12,324,285 B2
(45) Date of Patent: Jun. 3, 2025

(54) ULTRA-DENSE ARRAY OF LEDS WITH RUTHENIUM MIRRORS

(71) Applicant: Tectus Corporation, Saratoga, CA (US)

(72) Inventors: Kwong-Hin Henry Choy, San Jose, CA (US); Ewelina Natalia Lucow, Los Gatos, CA (US)

(73) Assignee: Tectus Corporation, Cupertino, CA (US)

( * ) Notice: Subject to any disclaimer, the term of this patent is extended or adjusted under 35 U.S.C. 154(b) by 484 days.

(21) Appl. No.: 17/712,650

(22) Filed: Apr. 4, 2022

(65) Prior Publication Data

US 2023/0317895 A1    Oct. 5, 2023

(51) Int. Cl.
| | | |
|---|---|---|
| *H10H 20/856* | (2025.01) | |
| *H10H 20/812* | (2025.01) | |
| *H10H 20/832* | (2025.01) | |
| *H10H 29/14* | (2025.01) | |
| H10H 20/854 | (2025.01) | |

(52) U.S. Cl.
CPC ........ *H10H 20/856* (2025.01); *H10H 20/812* (2025.01); *H10H 20/835* (2025.01); *H10H 29/142* (2025.01); H10H 20/854 (2025.01)

(58) Field of Classification Search
None
See application file for complete search history.

(56) References Cited

U.S. PATENT DOCUMENTS

| | | | |
|---|---|---|---|
| 8,629,474 B2 | 1/2014 | Lee | |
| 9,806,127 B1 | 10/2017 | Ahmed | |
| 2011/0070674 A1 | 3/2011 | Lee | |
| 2012/0119237 A1* | 5/2012 | Leatherdale | .......... H01L 27/156 |
| | | | 257/E33.006 |
| 2019/0123237 A1* | 4/2019 | Sakong | ................... H01L 33/12 |
| 2019/0179222 A1 | 6/2019 | Choy | |
| 2019/0207095 A1* | 7/2019 | Kardasz | ............. H01F 10/3286 |
| 2021/0159360 A1* | 5/2021 | Choy | .................... H01L 33/105 |
| 2021/0167246 A1 | 6/2021 | Choy | |
| 2022/0285425 A1* | 9/2022 | Young | ................... H01L 33/382 |

OTHER PUBLICATIONS

H. W. Jang et al., Applied Physics Letters, v. 85, p. 4421 (2004).
J. K. Kim et al., Applied Physics Letters, v. 84, p. 4508 (2004).
J.-S. Park et al., Superlattices and Microstructures, v. 52, p. 357 (2012).
P. P. Iyer, et al., Nature Photonics, v. 14 (2020).
International Search Report / Written Opinion in PCT/US2023/014641, Sep. 19, 2023.

\* cited by examiner

*Primary Examiner* — Xiaoming Liu
(74) *Attorney, Agent, or Firm* — Fenwick & West LLP

(57) ABSTRACT

In one aspect, the LEDs in an LED array include a semiconductor mesa and a ruthenium reflector positioned above the top surface of the semiconductor mesa. Working downwards from the ruthenium reflector, the mesa includes a top p-layer, an active region such as a quantum well region, and a bottom n-layer. The n- and p-layers may be reversed, so that the top layer is an n-layer and the bottom layer is a p-layer. The semiconductor layers have a mesa shape, with a smaller top surface and the ruthenium reflector above that. The sidewalls of the mesa extend downwards and outwards from the top surface.

19 Claims, 20 Drawing Sheets

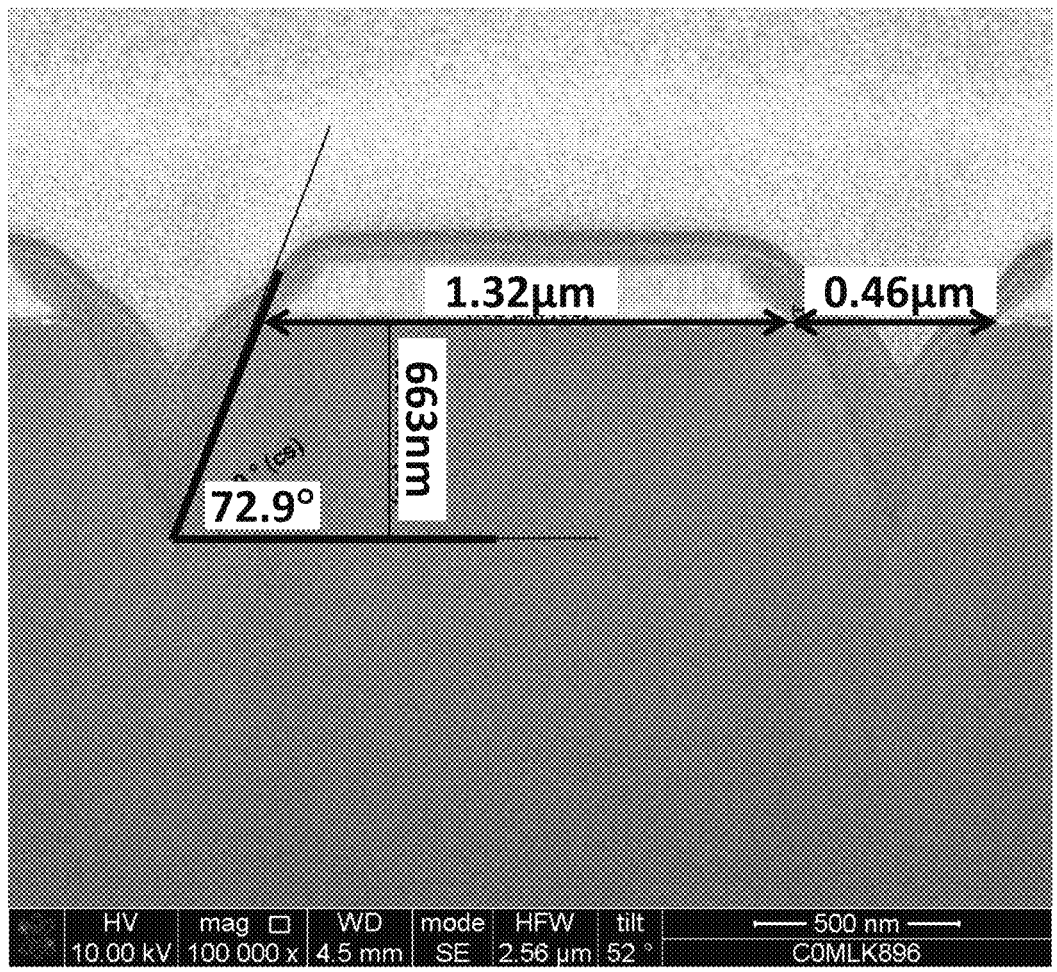
Fig. 3A(1)

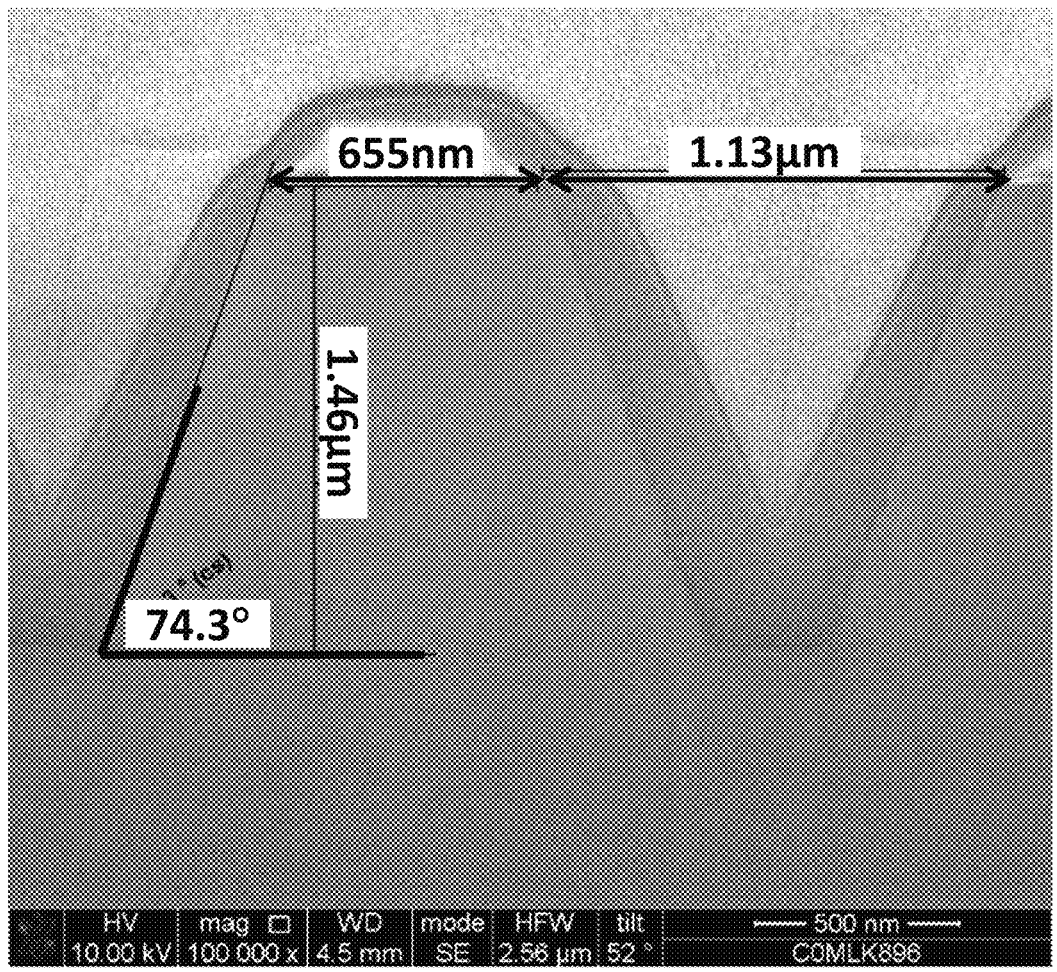
Fig. 3A(2)

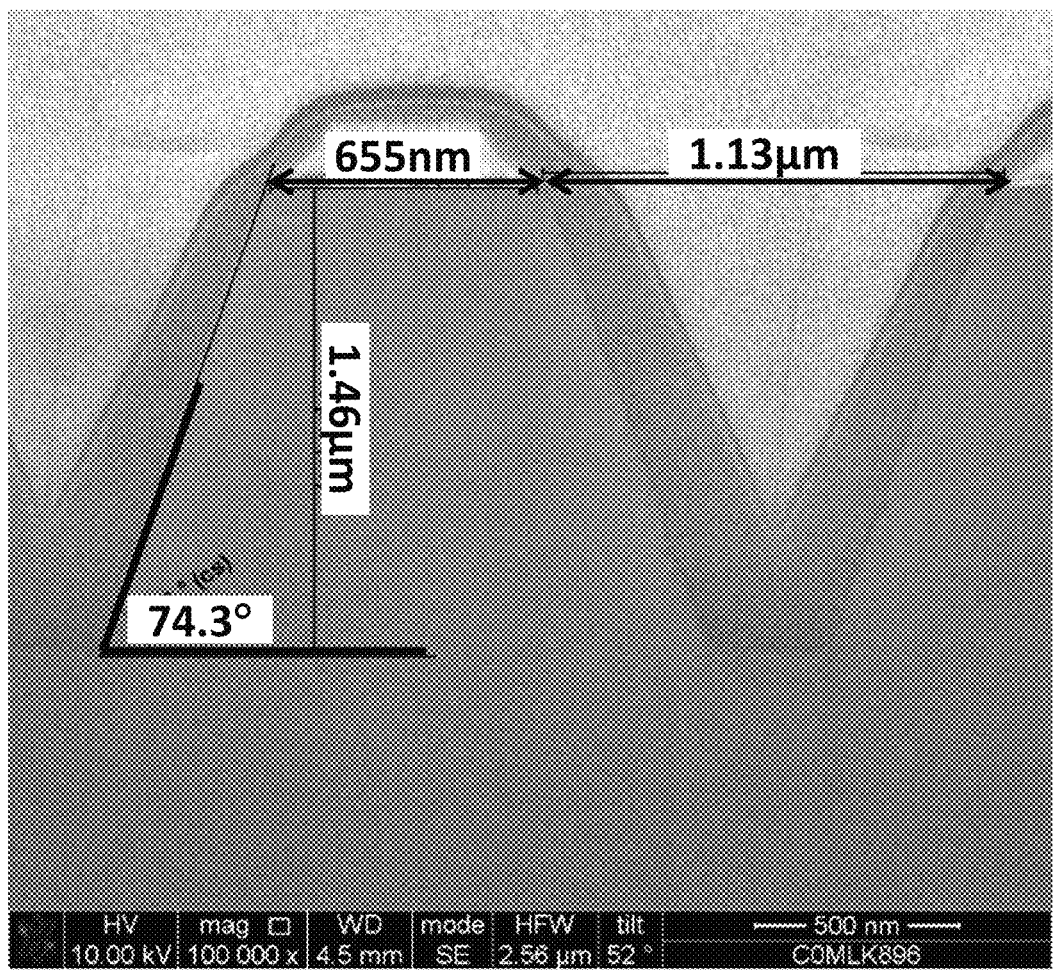
Fig. 3B(1)

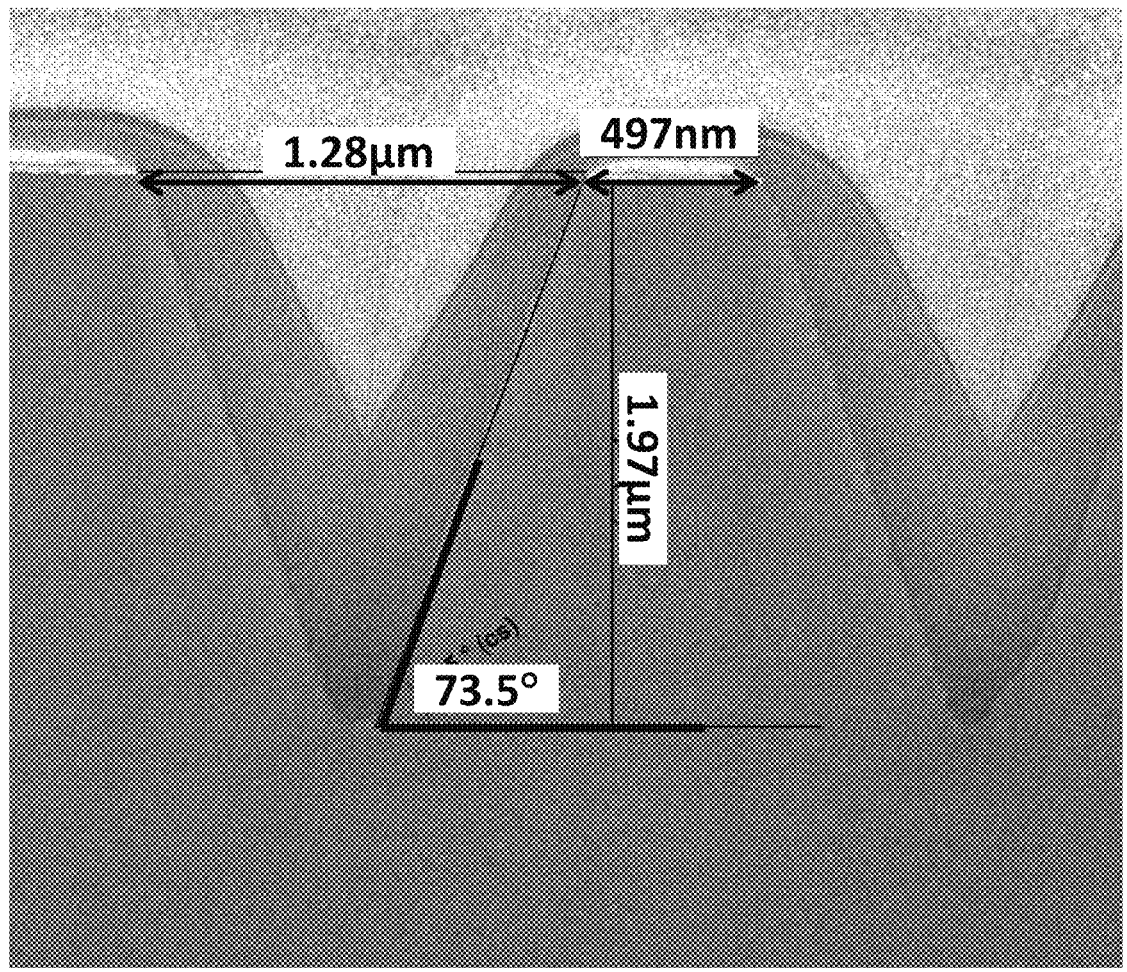
Fig. 3B(2)

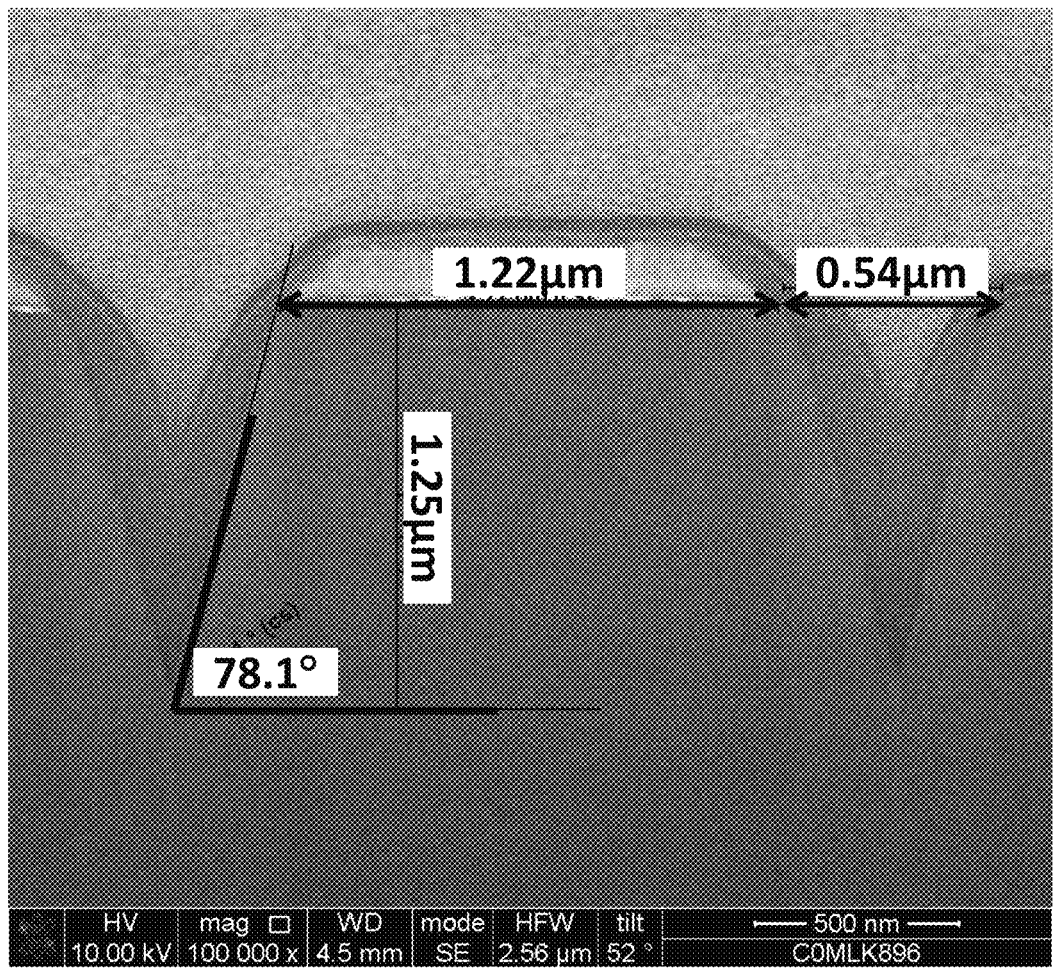
Fig. 3C(1)

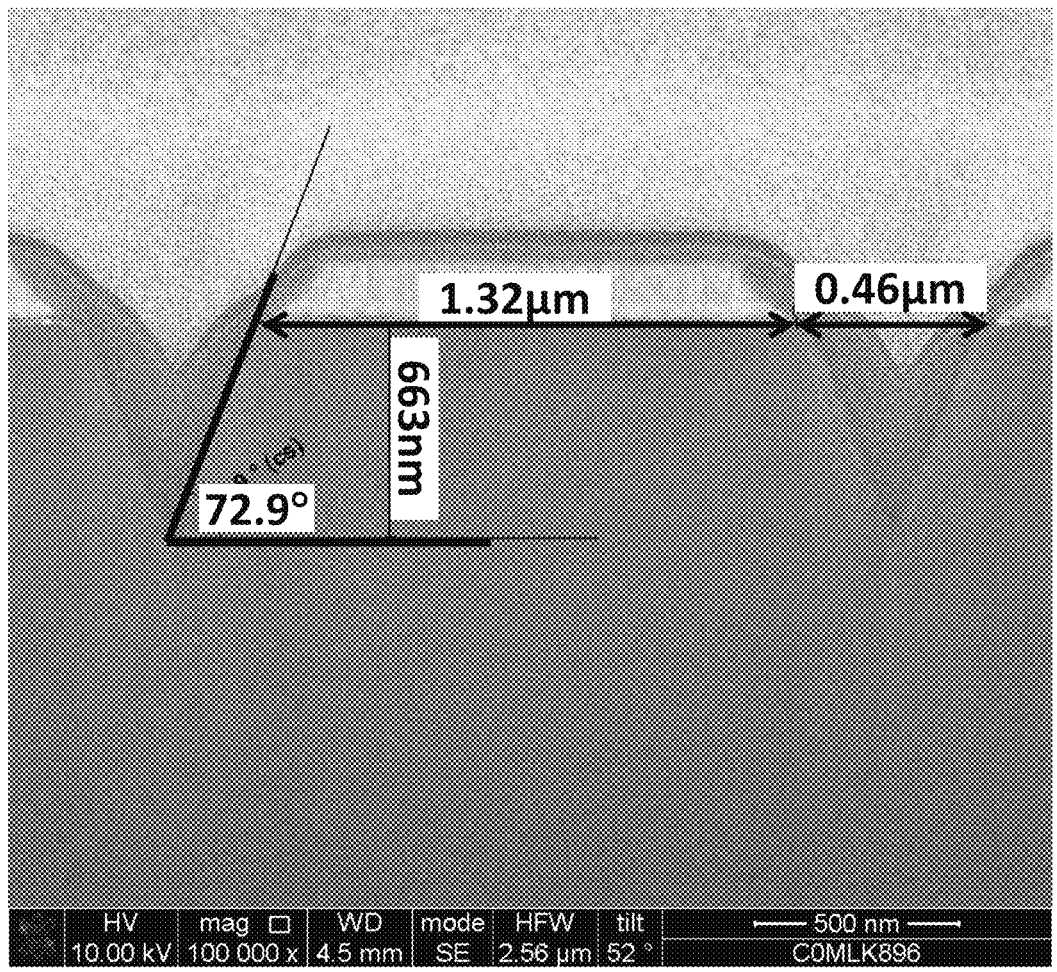
Fig. 3C(2)

ULTRA-DENSE ARRAY OF LEDS WITH RUTHENIUM MIRRORS

BACKGROUND

1. Technical Field

This disclosure relates generally to light emitting diode (LED) arrays and, more specifically, to ultra-dense LED arrays, such as for use in a contact lens.

2. Description of Related Art

A "femtoprojector" is a small projector that projects images from an image source. For example, femtoprojectors may be contained inside a contact lens and used to project images onto a user's retina. The image source and associated optical system are small enough to fit inside a contact lens. To meet this size requirement while still achieving reasonable resolution, the pixel sizes in the image source typically are much smaller than in image sources for other applications. For example, a conventional LED direct emission display uses discrete red, green, and blue emitting LEDs with resolutions of up to 500 pixels per inch (composite white pixels/inch) and about a 25 um (micron) pitch from one colored pixel to the neighboring color pixel. In contrast, an LED array for a femtoprojector contained in a contact lens preferably has pixel sizes of less than 1 um$^2$ in emitting area with a pixel pitch of 2 um or less. It is challenging to build LED arrays with such a small pitch.

Accordingly, what is needed are better approaches to forming an ultra-dense (and, therefore, correspondingly higher resolution) LED array.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

FIGS. 3A(1)-(2), 3B(1)-(2) and 3C(1)-(2) are photomicrographs of LEDs illustrating the effect of varying different process parameters.

DETAILED DESCRIPTION OF THE PREFERRED EMBODIMENTS

Figure 1:
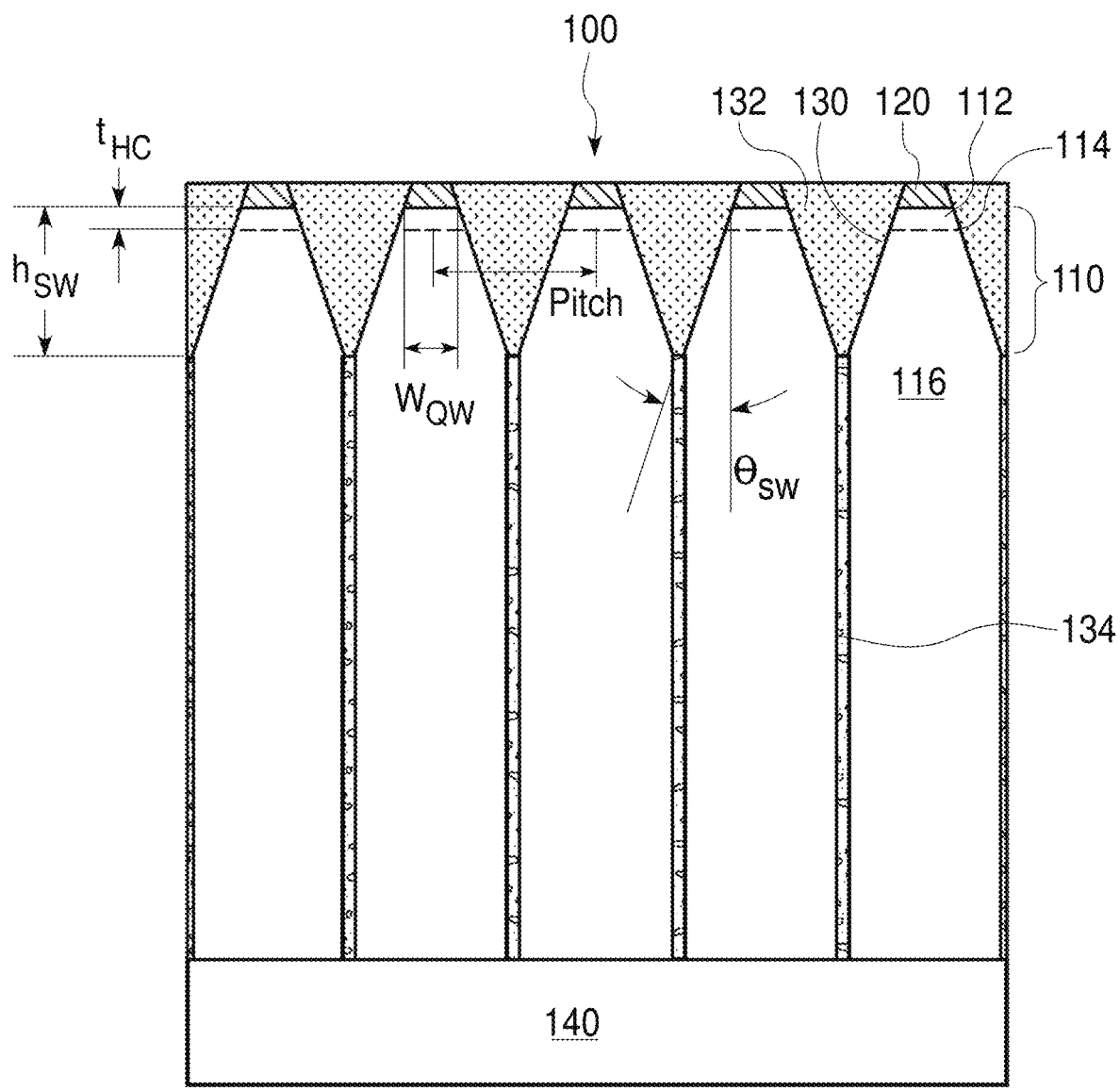
FIG. 1 is a cross-sectional diagram of an LED array with ruthenium reflectors.

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

In one approach, the LEDs in an LED array include a semiconductor mesa and a ruthenium reflector positioned above the top surface of the semiconductor mesa. Working downwards from the ruthenium reflector, the mesa includes a top p-layer, an active region such as a quantum well region, and a bottom n-layer. The n- and p-layers may be reversed, so that the top layer is an n-layer and the bottom layer is a p-layer. The semiconductor layers have a mesa shape, with a smaller top surface and the ruthenium reflector above that. The sidewalls of the mesa extend downwards and outwards from the top surface.

One property of ruthenium is that it may alternately be easy to etch and hard to etch, depending on the etch process. During fabrication, a ruthenium layer may be deposited on the top layer of the semiconductor stack and patterned using photoresist. The pattern in the photoresist may be transferred to the ruthenium by using an etch process that readily etches ruthenium. A typical etch process is conducted in an inductive coupled plasma reactive ion etching chamber. Typical chemicals are $Cl_2$ or $BCl_3$ gases and with the addition of oxygen. The ionized oxygen oxidizes the ruthenium, which is in turn removed by the chlorine ($Cl^-$) ions. Typical chamber pressure can be between 0.1 to 10 psi, typical flow rates of the gases can be between 1 to 100 sccm, and typical power of the etch can be between 10 W to 500 W. This defines the size and shape of the ruthenium reflector, which defines the size and shape of the top surface of the mesa.

The sidewalls are defined by etching into the semiconductor stack. However, the semiconductor stack may be gallium nitride (GaN) or other materials that are difficult to etch. If the reflector were aluminum or other conventional reflector materials, the GaN etch may undercut the reflector. The undercutting becomes more significant and problematic as the top surface area of the mesas becomes smaller (i.e., smaller pixel sizes) and as the duration of the GaN etch becomes longer (i.e., deeper GaN etches). With ruthenium, the oxygen can be removed from the GaN part of the etching process. Under these conditions, ruthenium is not easily etched, thus significantly reducing undercutting while allowing deep, narrow trenches to be etched into the semiconductor stack. For example, the undercutting may be limited to 10% or less of the reflector width when ruthenium is used with small pixels, whereas other materials such as aluminum may exhibit more undercutting. The trenches etched in the GaN define the individual LEDs, and the sidewalls of the trenches may be used to increase the amount of useful light exiting the LEDs. Another property of ruthenium is that gallium from the semiconductor stack may intermix with aluminum or other reflective metals, but does not intermix as easily with ruthenium.

FIG. 1 is a cross-sectional diagram of an array of LEDs 100. Each LED 100 includes a semiconductor stack with a top p-layer 112, active region 114, and bottom n-layer 116. The active region 114 may be a quantum well region. Other gain media include heterostructures and quantum dot layers. The top of the semiconductor stack is in the shape of a mesa 110. The LEDs 100 also include a ruthenium reflector 120 located above the top layer 112, on a top surface of the mesa 110. The top reflector 120 and top layer 112 may form a half cavity for light emitted from the active region 114, as described in more detail below. The mesa 110 also has reflective sidewalls 130 which extend downwards and outwards from the top of the mesa. The sidewalls may be "straight," meaning that in cross-section they appear as lines. Their three-dimensional shape may be flat (e.g., a face of a pyramid) or conical. In this example, the sidewalls 130 are constructed by forming a trench 132 between adjacent mesas 110. The trench 132 extends through the top reflector 120 and downwards through the semiconductor stack into the bottom layer 116. The trench 132 may be filled by a dielectric, so that the sidewalls 130 are reflective due to total internal reflection at the interface between the dielectric and the semiconductor stack. Alternatively, the sidewalls 130 may be coated with a reflective material. The trenches may extend 134 beyond the mesas into the bulk region of the bottom layer 116. The array also includes an encapsulation material 140 below the bulk n-layer 116. The bulk p-layer 116 may be thinned.

As shown in FIG. 1, the n-layer 116 may be separated by trenches 134 into high aspect ratio pillars for individual LEDs. For example, the LED pillars may include 2.75 um of n-doped GaN 116, 0.05 um of InGaN multiple quantum well action region 114, and 0.2 um of p-doped GaN 112. Light is generated at the active region 114, so the optical path from the active region to the exit of the LED at the bottom end of the n-doped region 116 is 2.75 um long. If the LED pillar is 1 um wide, then this optical path has a height:width aspect ratio of 2.75:1.

The trenches 134 between the LED pillars may be coated with a dielectric and a metal fill which provides structural support and may also provide electrical connection to the common cathode pads for the n-doped GaN 116. In order to fabricate these structures, with a 3 um tall LED pillar, a 3 um tall and 0.3 um wide trench is first etched between the LED pillars. This is a trench with a height:width aspect ratio of 10:1. The trench is 3 um deep because it electrically isolates the p-doped GaN 112 from adjacent pixels. The trench also extends through reflector 120 so the total trench depth may be more than 3 um. The sidewalls are then conformally coated with the dielectric and a metal layer. This narrows the trench to 0.16 um (but still 3 um tall), when it is filled with metal. The dimensions given above are just examples.

An alternative method of fabrication is to first carry out a tapered etch near the metal side of the pixels (the top surface in FIG. 1), for example forming just the mesa 110 and shallow trench 132 but not the deep trench 134. The etch is shallow and does not penetrate through the entire thickness of the GaN layers. The tapered region 132 can then be filled with dielectric, or with a combination of dielectric and metal. The GaN LED array is bonded to driver electronics. The substrate is removed and the light-emitting side of the GaN layers (the bottom surface in FIG. 1) can be thinned. From that side, the thin trenches 134 can be etched until they reach the tips of the filled tapered regions 132.

Typical ranges are the following. For the trench 134 between pillars: 0.2-1 um for the full gap width. For the LED pillar: 1-5 um for n-GaN 116, 0.05±0.025 um for MQW 114, and 0.2±0.1 um for p-GaN 112.

Electrical contact to individual LEDs 100 may be made through the top layer 112, typically by providing a metal contact to the ruthenium mirror 120. A common contact to the LEDs 100 may be made through the bottom layer 116. A half cavity formed by top reflector 120 and top layer 112, and the angled sidewalls 130 together redistribute the light emitted from the active region so that more of it couples into the projection optics (not shown in FIG. 1). The deep, vertical trenches 134 between LED pixels may be filled with absorptive metal such as chromium or tungsten. The reflectivity is high even for very absorptive metals when light is incident at more oblique angles. For rays that are redirected by the half cavity and the sloped sidewalls to near normal, the reflection will be high. Other rays will experience higher absorption by the absorptive metal and can be suppressed effectively after a few bounces.

FIG. 1 is also labelled with parameters for the LED array. "Pitch" is the pitch between adjacent LEDs in the array. $\theta_{SW}$ is the slope angle of the sidewalls measured from the normal direction, so a sidewall angle $\theta_{SW}=0°$ would be a vertical sidewall. $h_{SW}$ is the height or thickness of the sidewalls, measured from the bottom of the top reflector 120. $t_{HC}$ is the height or thickness of the half cavity. $w_{QW}$ is the width of the active region 114.

FIG. 1 is drawn to scale for a GaN (gallium nitride) LED array with pitch=1.3 um. The sidewalls 130 have sidewall angle $\theta_{SW}=15°$ and are $h_{SW}=0.7$ um tall. In this example, the top p-layer 112 is 0.17 um thick ($t_{HC}=0.17$ um), creating a half cavity that is 0.78 wavelengths. The bottom n-layer 116 is 5.5 um thick.

Other designs may use other dimensions. For example, the pitch may be in a range of 0.5 um to 2.0 um, with active regions 114 having a width $w_{QW}$ of 40% to 90% of the pitch. The top mirror 120 will have a similar width and, therefore, may occupy 10% to 80% of the total area. Such small pitches will result in high aspect ratio structures. For example, the mesas 110 and sidewalls 130 (not including extensions 134) may have heights in a range of 0.7 um to 1.5 um.

Figure 2A:
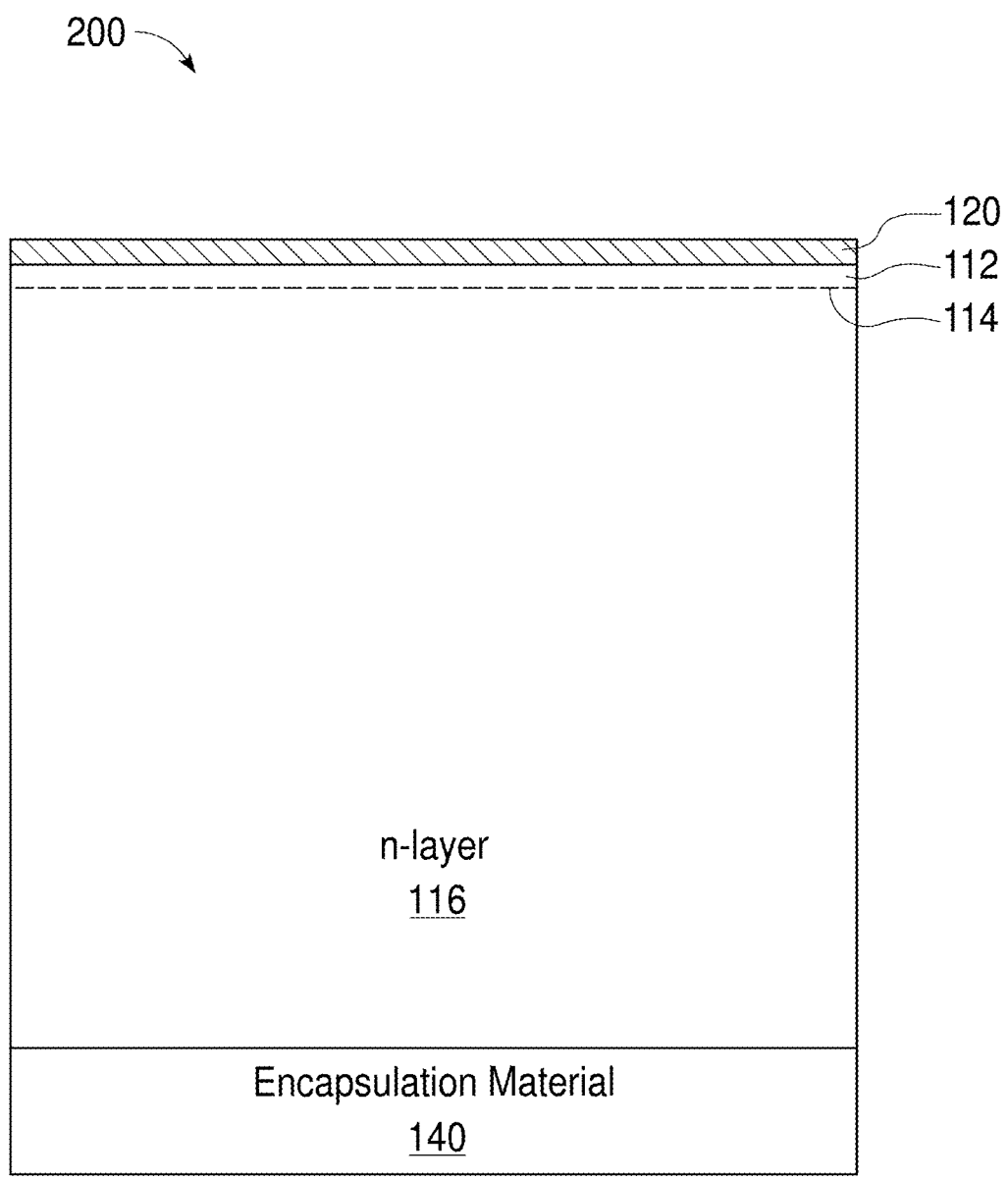
FIGS. 2A-2G are cross-sectional diagrams illustrating fabrication of an LED array with ruthenium reflectors.
Figure 2B:
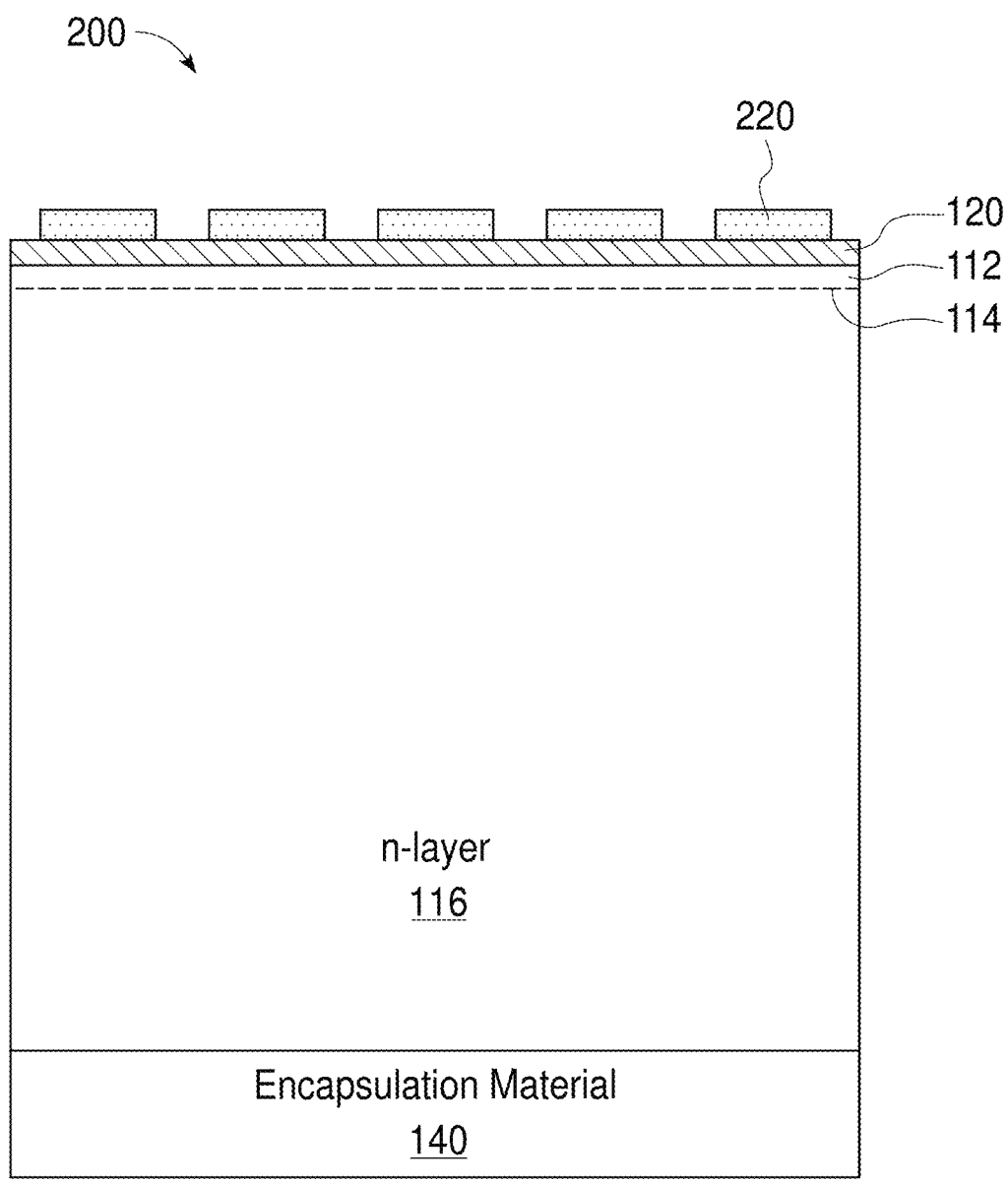
Figure 2C:
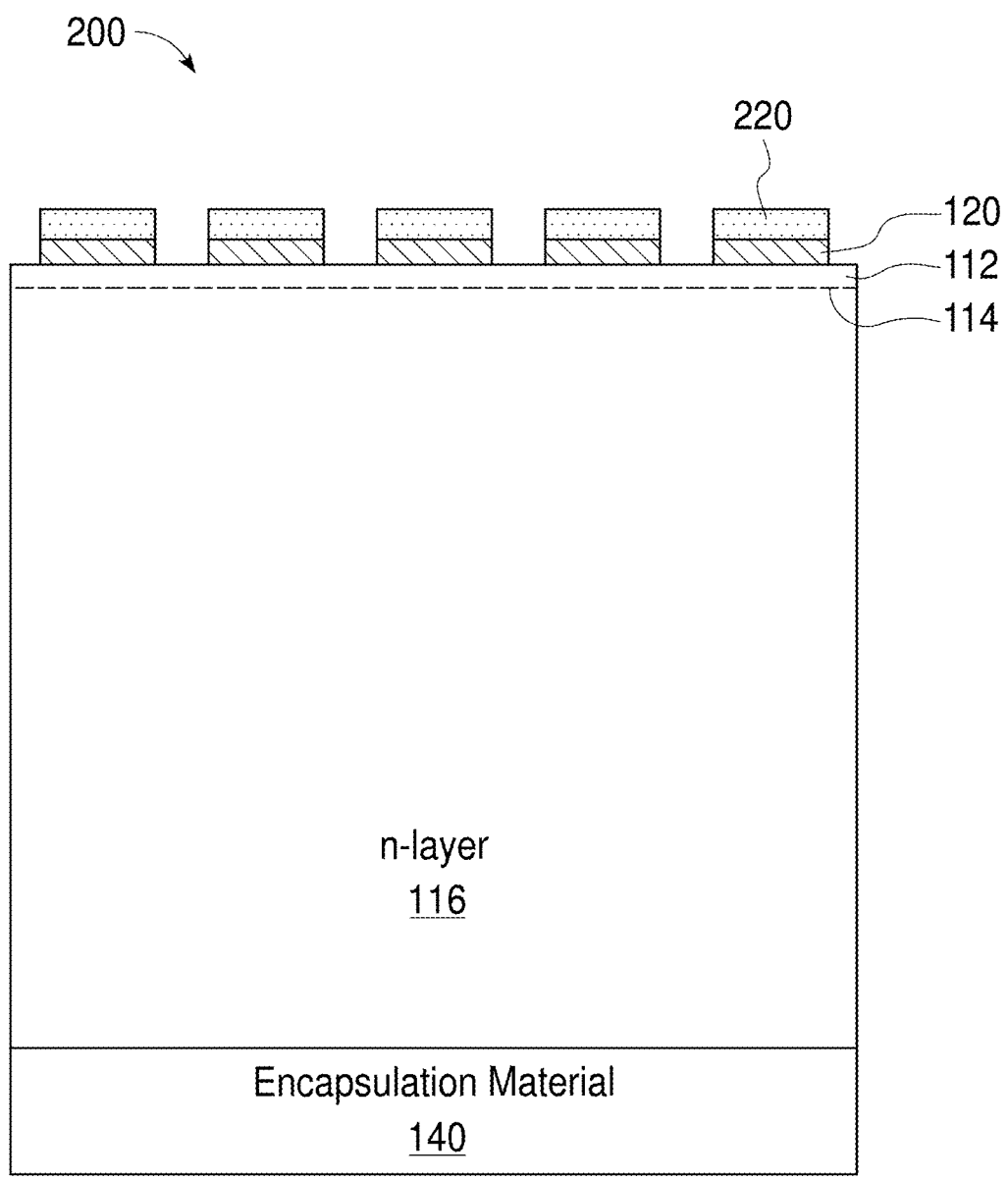

FIGS. 2A-2G are cross-sectional diagrams illustrating fabrication of a gallium nitride (GaN) LED array with ruthenium mirrors. In FIG. 2A, the semiconductor wafer 200 has already been partially processed and includes, from top to bottom: a ruthenium layer 120, thinner p-layer 112, active region 114, thicker n-layer 116, and encapsulation layer 140. This semiconductor stack may be fabricated using conventional methods, including expitaxy for the active region 114 and p-layer 112 and then depositing the ruthenium layer 120 and possibly other layers such as a capping layer for the mirror, on the existing semiconductor stack. In FIGS. 2A-2D, a sidewall trench is etched into this stack. In FIG. 2B, a photoresist layer 220 is deposited on top of the ruthenium 120 and then patterned. The ruthenium is then etched using a chemistry that includes oxygen. This type of etch is effective to etch through the ruthenium and other layers above it, transferring the pattern from the photoresist to the these layers, as shown in FIG. 2C.

Figure 2D:
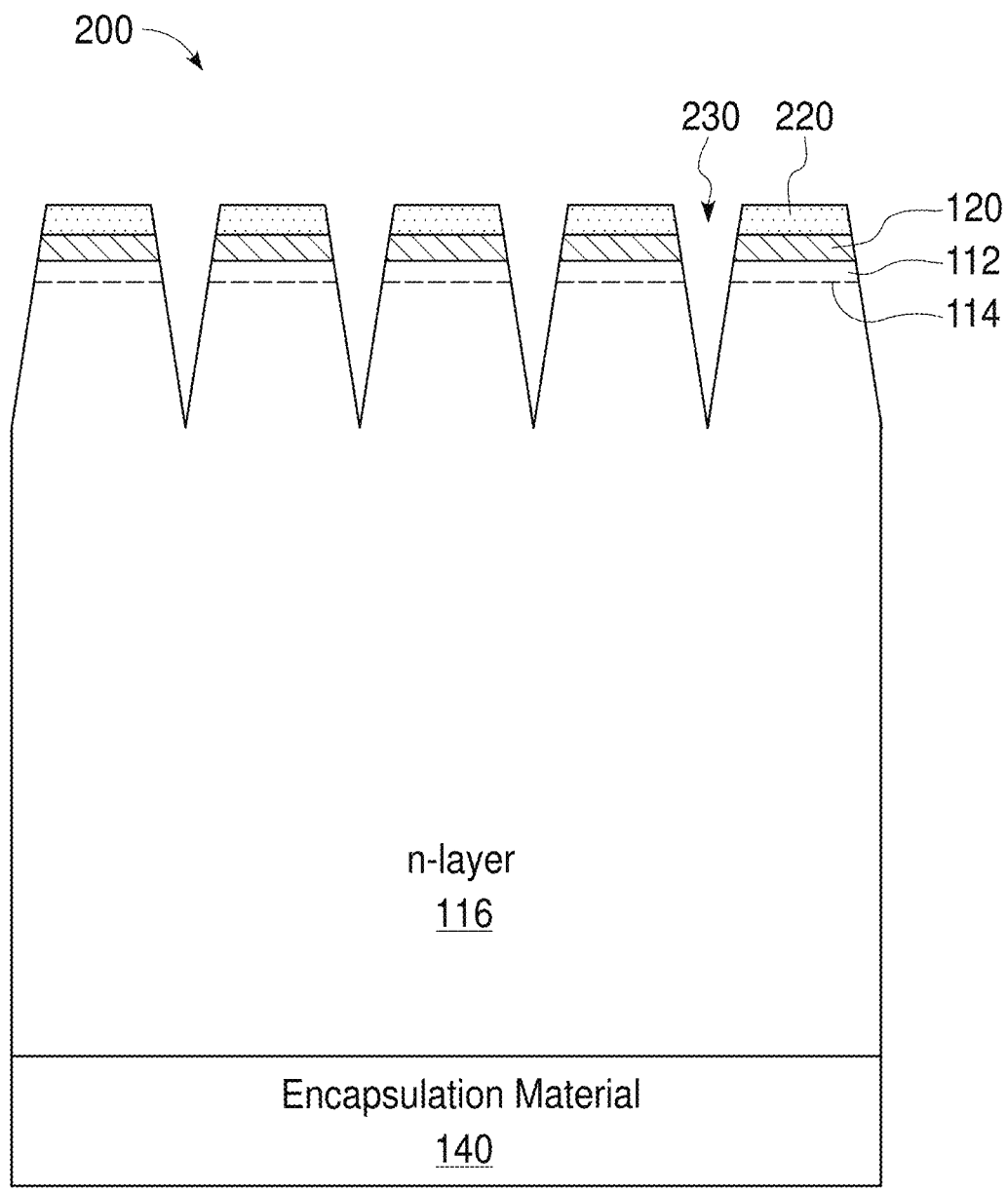

The underlying GaN stack is then etched through the gaps between the ruthenium 120. An etch chemistry without oxygen is used. As a result, this etch is not effective for etching ruthenium, which prevents significant undercutting of the ruthenium 120. The ruthenium 120 acts as a hard mask. FIG. 2D shows the resulting trenches 230 in the GaN semiconductor, separating adjacent LEDs. The sidewalls of these trenches may be used to increase light collection efficiency from the active regions of the LEDs.

The depth and sidewall angle of trenches 230 may be controlled by varying the size of the gap between the ruthenium reflectors 120, the duration of the etch and the chamber pressure during the etch. Increasing the gap width results in a deeper trench and has only a minor effect on the sidewall angle. Increasing the etch duration also increases the trench depth with little to no effect on the sidewall angle. Increasing the chamber pressure results in shallower trenches and less vertical sidewalls.

FIGS. 3A-3C show some experiments that illustrate these effects. In these figures, the top lighter area is the ruthenium mirror 120 and the darker gray area is the mesa 110. FIGS. 3A(1) and 3A(2) show the effect of varying the size of the gap between adjacent ruthenium mirrors. In both of these examples, the pitch is approximately 1.78 um. In FIG.

3A(1), the ruthenium mirror has a width of approximately 1.32 um with a gap of 0.46 um between adjacent mirrors. In FIG. 3A(2), the ruthenium mirror has a width of approximately 0.65 um with a larger gap of 1.13 um between adjacent mirrors. Both samples have been etched for the same duration. The resulting trench has a depth of 0.66 um in FIG. 3A(1) and 1.46 um in FIG. 3A(2). The sidewall angles are 17.1 and 15.7 degrees, respectively.

FIGS. 3B(1) and 3B(2) show the effect of varying the etch duration. The example in FIG. 3B(1) has been etched for a shorter duration than the example in FIG. 3B(2). The longer etch duration results in a deeper trench: 1.46 um in FIG. 3B(1) for the shorter duration and 1.97 um in FIG. 3B(2) for the longer duration. The sidewall angles are approximately the same, at 15.7 and 16.5 degrees, respectively.

FIGS. 3C(1) and 3C(2) show the effect of varying the chamber pressure during etch. The example in FIG. 3C(1) has been etched under standard pressure, and the example in FIG. 3C(2) has been etched under higher pressure. The higher pressure results in shallower sidewalls: 11.9 degree sidewall angle in FIG. 3C(1) for the lower pressure and 17.1 degree sidewall angle in FIG. 3C(2) for the higher pressure.

Figure 4A:
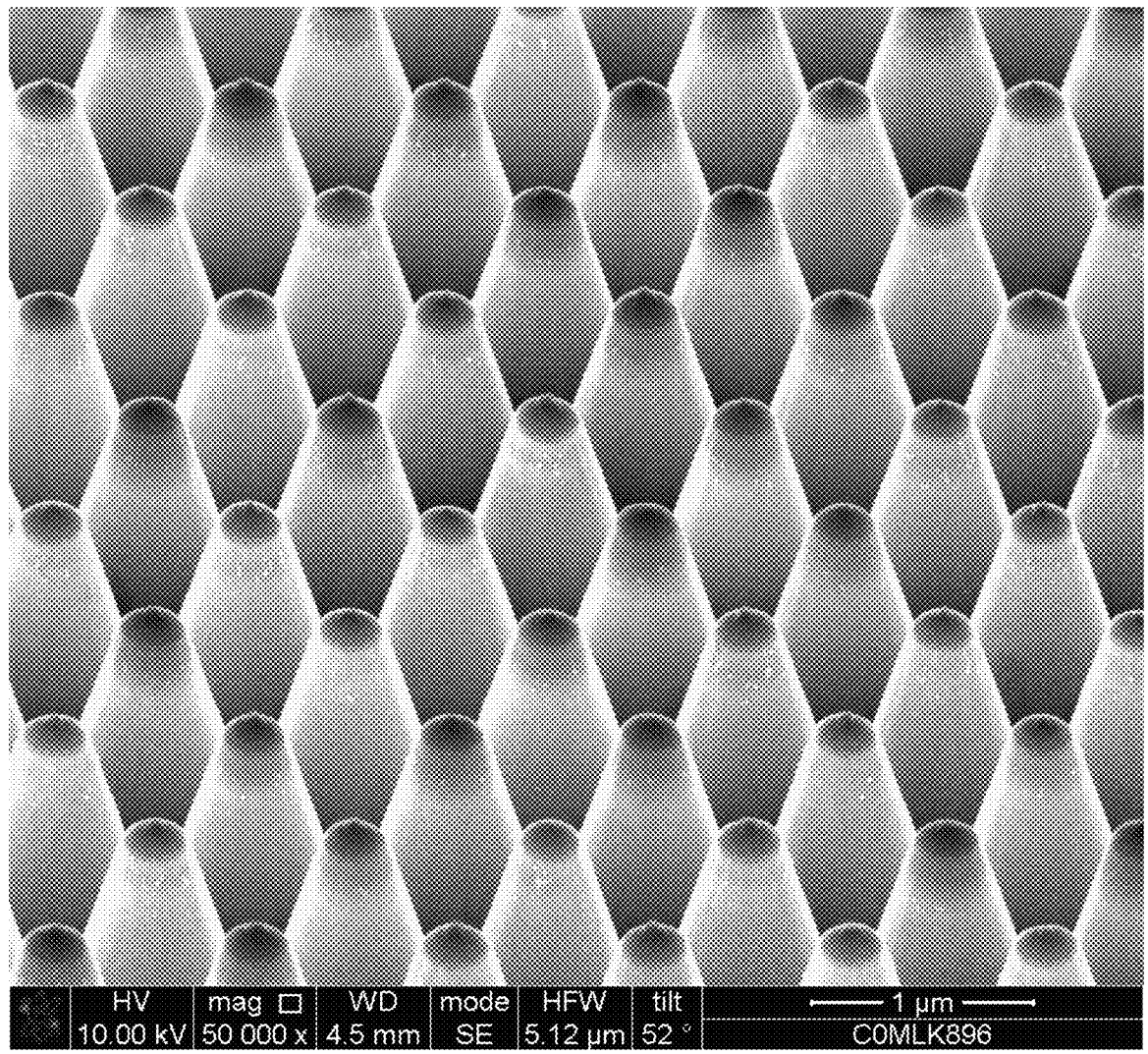
FIGS. 4A and 4B are photomicrographs of LEDs with ruthenium reflectors.
Figure 4B:
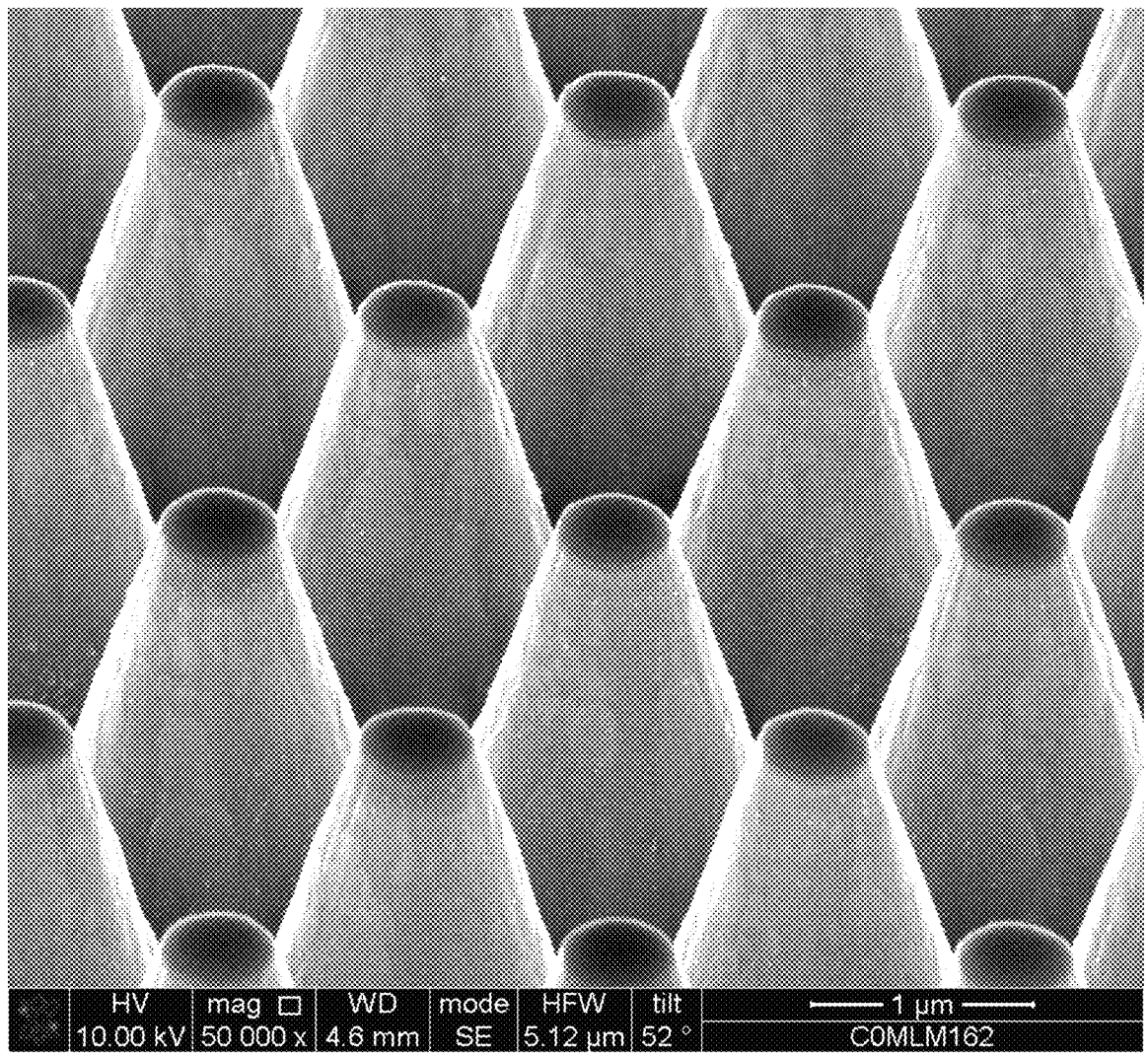

FIGS. 4A and 4B are photomicrographs of two different examples of semiconductor mesas with ruthenium mirrors fabricated using the process described above. The mirror width may fall in the range from 30% to 85% of the pitch. The area ratio would then be proportional to the square of these width ratios.

Figure 2E:
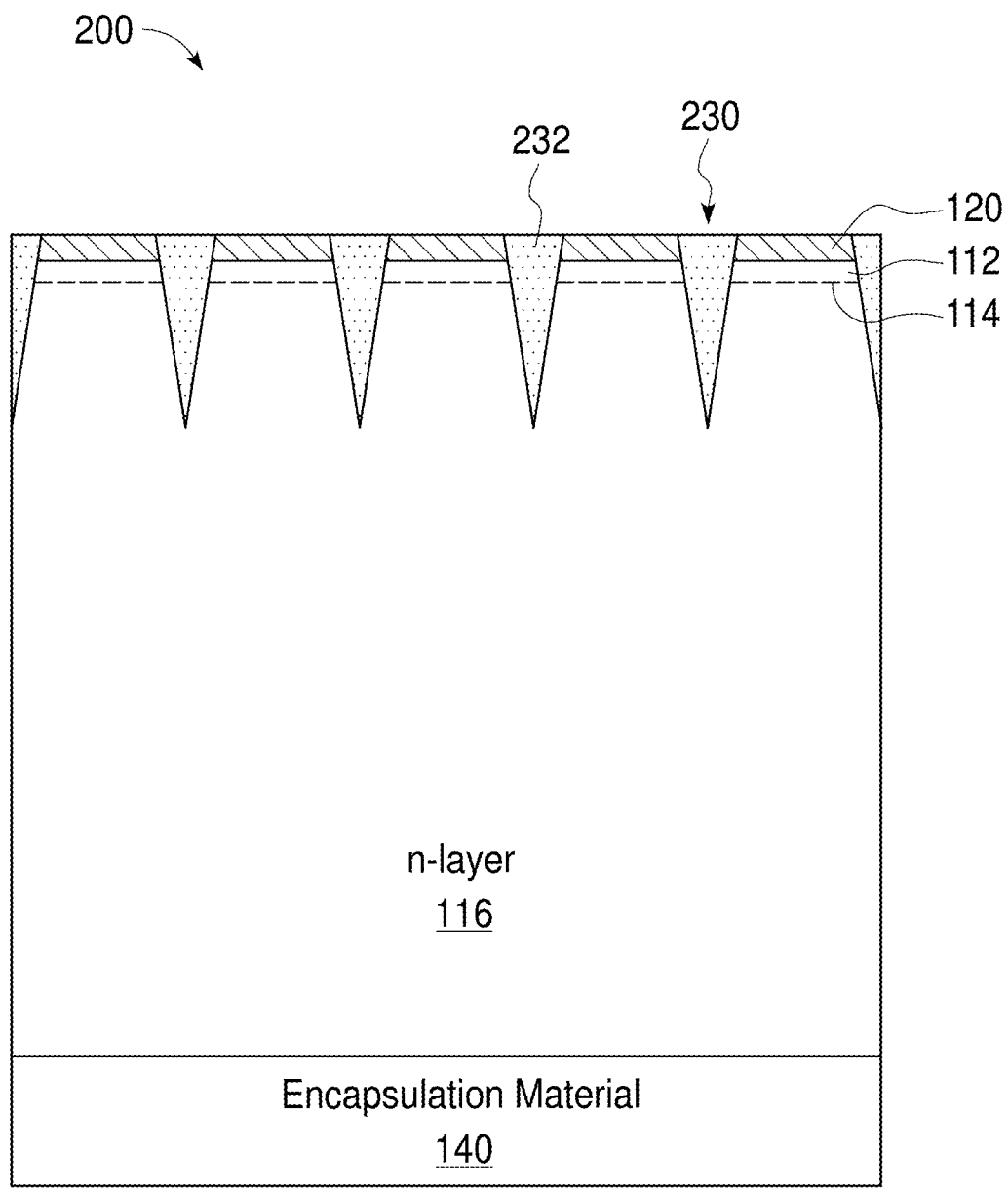

Returning to FIG. 2E, dielectric 232 is deposited on the wafer, filling the trenches 230. Alternatively, a dielectric 232 may partially fill the trenches, with an absorptive material deposited after the dielectric. Examples of dielectric 232 include $SiO_2$, $Si_3N_4$, $Al_2O_3$, benzocyclobutene (BCB), spin-on glass, and polyimide. Because of the high aspect ratios involved, the top surface of the dielectric may exhibit some topology. The top surface is planarized, for example by chemical mechanical polishing. This forms a flat surface with both the reflector layer 120 and adjacent dielectric 232, as shown in FIG. 2E. In some cases, the surface flatness is 200 nm or better. In alternative approach, the planarized surface may be produced by depositing BCB and then etching back with a dry etch.

Figure 2F:
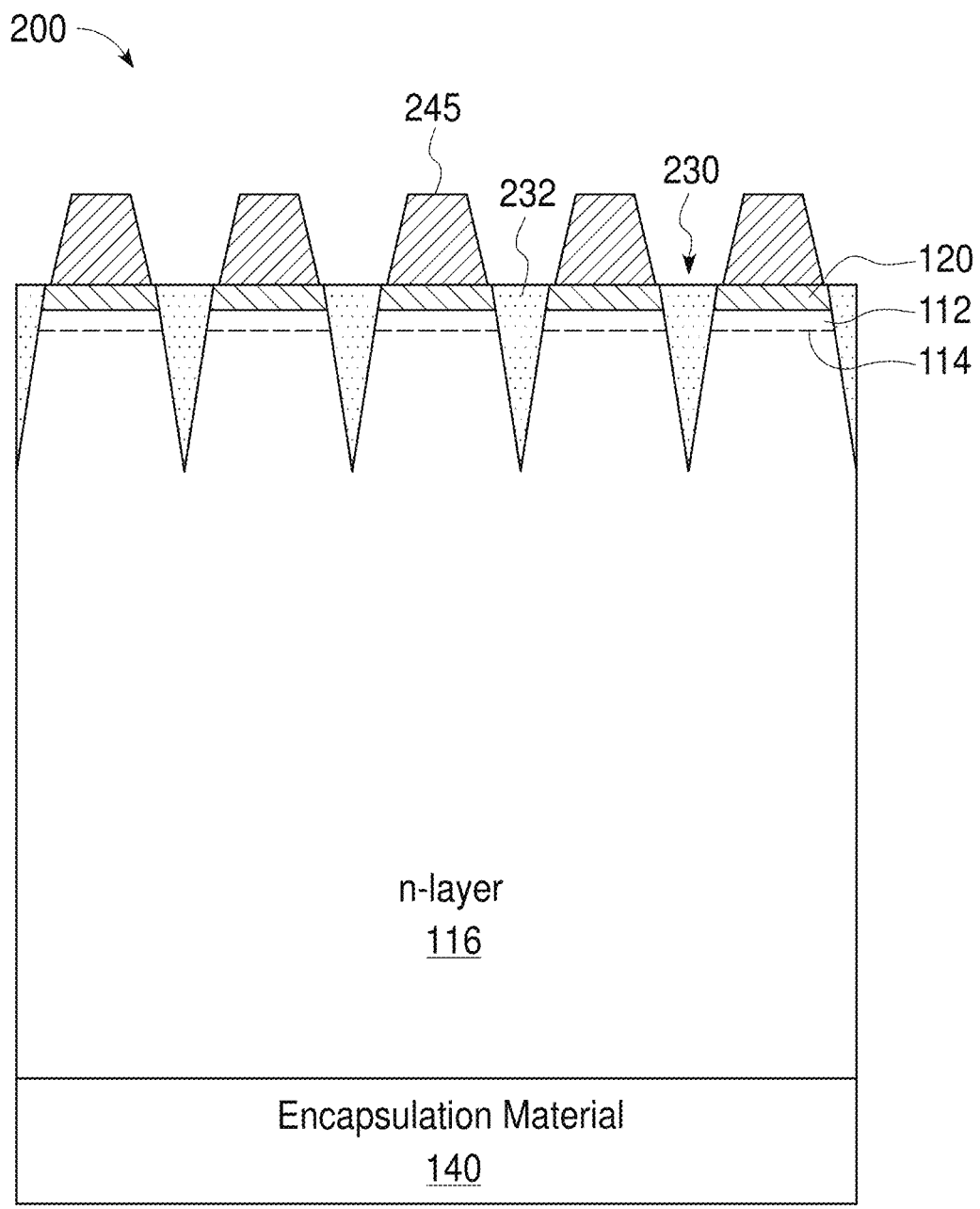

Next, metal contacts to the reflector layer 120 are formed. Because these LED pixels are so small, it can be difficult to form metal contacts on the reflector layer 120 alone, if the adjacent flat dielectric 232 were not also present. In one approach, the metal contacts are formed using a liftoff process. A photoresist structure is deposited on the flat surface and then patterned. The dielectric 232 is covered by the photoresist structure, but the reflector layer 120 is exposed. The photoresist structure is topped by a hard mask such as metal or oxide. A metal layer is deposited on this structure. The metal layer deposited on the reflectors 120 becomes the metal contacts to the LEDs. The metal layer deposited on the photoresist structure is removed by liftoff. The resulting metal contacts 245 are shown in FIG. 2F. An alternative to the liftoff process is metal deposition by electroplating, followed by a metal etch.

Planarizing the reflector 120 and dielectric 232 together creates a larger flat surface on which to deposit the photoresist and metal structures. The metal contacts 245 may have a width of between 0.4 um to 2 um and a height of 1 um to 2 um. The aspect ratios (height:width) of these features may be 2:1 or higher.

Figure 2G:
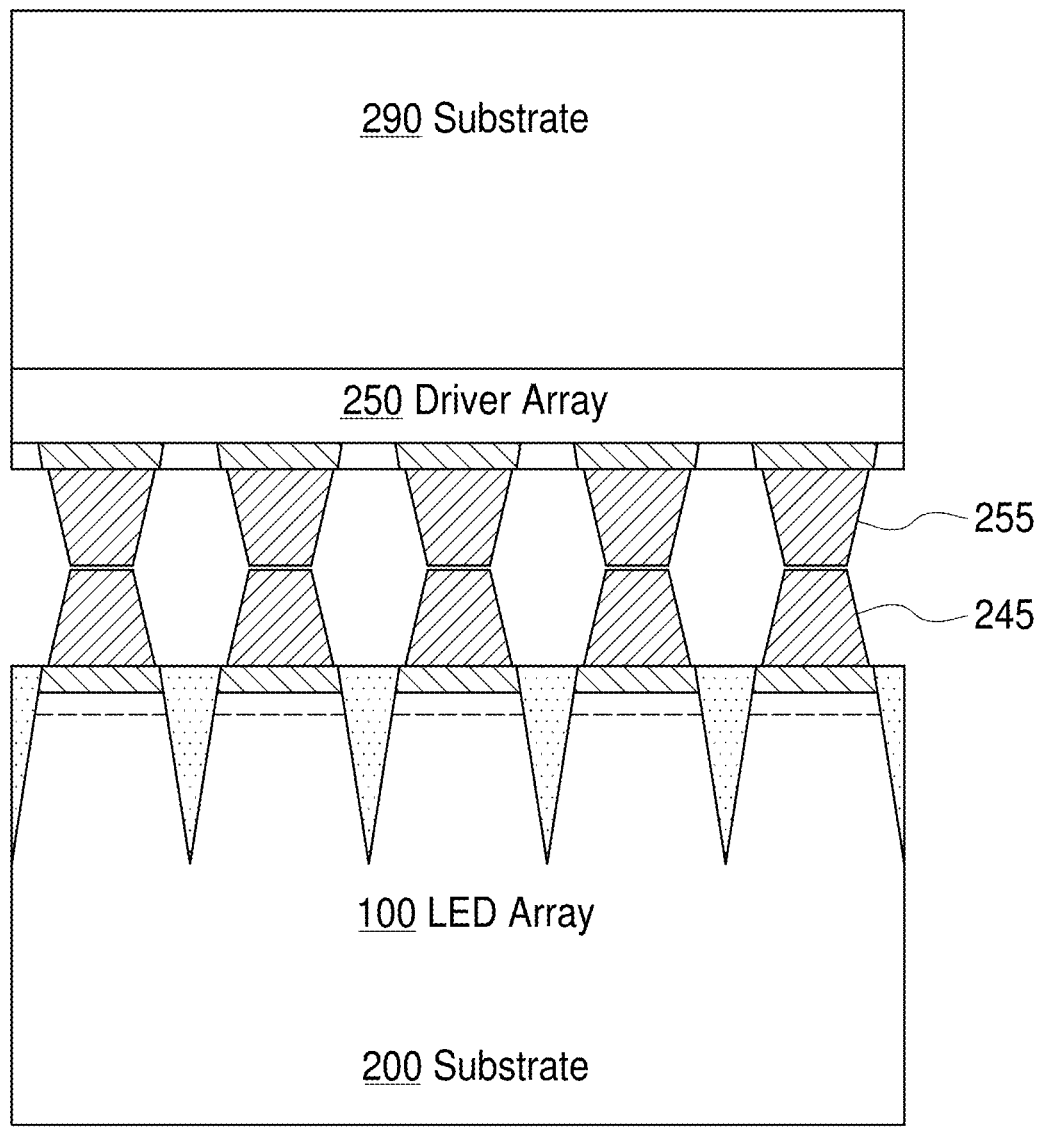

As shown in FIG. 2G, the LED array 100 is supported on one substrate 200. An array 250 of corresponding pixel drivers is supported on another substrate 290. The pixel drivers drive the LEDs. For example, the LED array 100 may be GaN LEDs on a GaN substrate, while the pixel drivers are CMOS drivers on a silicon substrate. The metal bumps 245 on the LED substrate 200 may then be bonded to corresponding metal bumps 255 on the pixel driver substrate 290. Thermal compression bonding may be used. In this way, the LED array 100 may be connected to the corresponding pixel drivers 250 to form an image source.

Other processes may be used to bond the LED array 100 to the CMOS drivers. For example, contacts may be formed by depositing an oxide layer above the ruthenium reflector and then forming metal plugs through the oxide layer contacting the ruthenium reflector. See U.S. patent application Ser. No. 17/154,480, "Ultra-dense array of LEDs with half cavities and reflective sidewalls, and hybrid bonding methods", which is incorporated by reference herein.

The process and structure shown in FIGS. 2A-2G are an example. Other variations will be apparent. For example, other layers may be used above or below the ruthenium reflector. In some cases, the ruthenium mirror may be in direct contact with the top surface of the semiconductor mesa. In other cases, there may be intermediate layers between the ruthenium and the top surface. For example, titanium, chromium or nickel may be used to promote adhesion of the ruthenium to the underlying material. As another example, a tantalum (Ta) layer may be deposited on top of the ruthenium reflector to form a protective cap. Ta, TaN and TiN are other possible layers.

As described previously, a combination of a half cavity and reflective sidewalls may be used to improve the power distribution so that more light falls within the collection angle of the projection optics illuminated by the LED array. Without additional structures, the light generated by the active region 114 would have an isotropic distribution and not much of the light would fall within the collection angle of the projection optics. However, the reflector 120 and p-layer 112 form a half cavity for the light emitted from the active region 114. This alters the angular power distribution. Reflective sidewalls 130 of the mesas 110 further reflect light from the altered power distribution into the collection angle of the projection optics.

Figure 5:
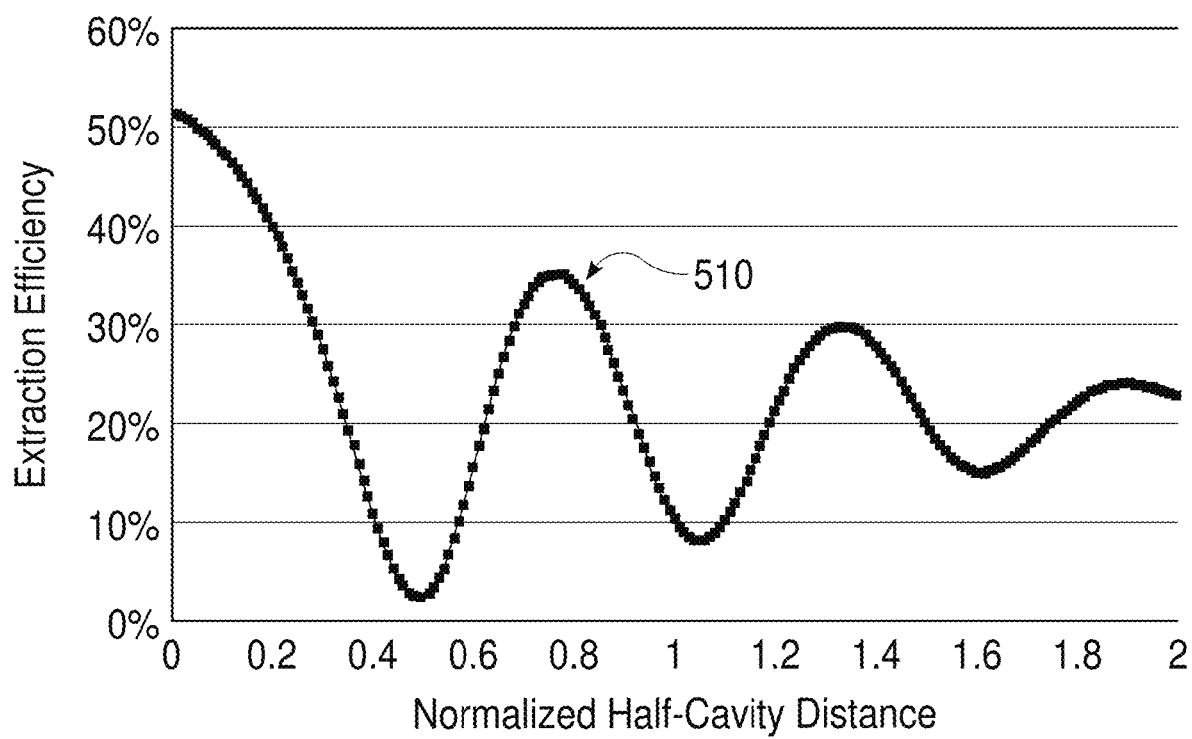
FIG. 5 is a plot of extraction efficiency as a function of half-cavity thickness.

FIG. 5 shows the effect of the half cavity. In the half-cavity effect, the downward emitted light from the active region 114 interferes with upward emitted light that is reflected from the ruthenium reflector 120. As a result, the power distribution of the light is redistributed from an isotropic distribution to some other distribution, depending on whether the waves propagating along a particular direction are constructively or destructively interfering. If the semiconductor 116 has a higher refractive index than the encapsulating material 140, then the interface between these two materials 116, 140 defines a critical angle, $\theta_c$. Light incident at angles that are more oblique than the critical angle will be totally internally reflected at the interface.

FIG. 5 is a plot of extraction efficiency as a function of half-cavity thickness. The half-cavity thickness ($t_{HC}$ in FIG. 1) is normalized by the wavelength in the medium. In this example, the refractive indices of the semiconductor 116 and the encapsulating material 140 are 2.4 and 1.6, respectively, which yields a ratio of 2.4/1.6=1.5 and a critical angle $\theta_c$ of slightly more than 40 degrees. Other materials may be used. The ratio of refractive indices may be greater than 1.2. The extraction efficiency in FIG. 5 is defined as the percentage of emitted light that falls within the critical angle, assuming that the structures are all infinite in lateral extent, meaning that effects of pixelation and sidewalls are ignored. The plot has maxima at approximately $0.00\lambda$, $0.78\lambda$, $1.34\lambda$, etc.

For each of the maxima and minima of FIG. 5, the half cavity redistributes light emitted from the active region into an angular power distribution with one or more lobes. For example, at maxima 510, there are two lobes with maximum power at approximately 35° and 74°, etc. The sidewalls 130 may be used to redirect the lobe(s) so that they fall within the collection angle of the projection optics. The tuning of the half-cavity distance may be combined with the sidewall and/or reflector shaping to enhance the control of the directionality and increase coupling efficiency to the projection optics.

Figure 6:
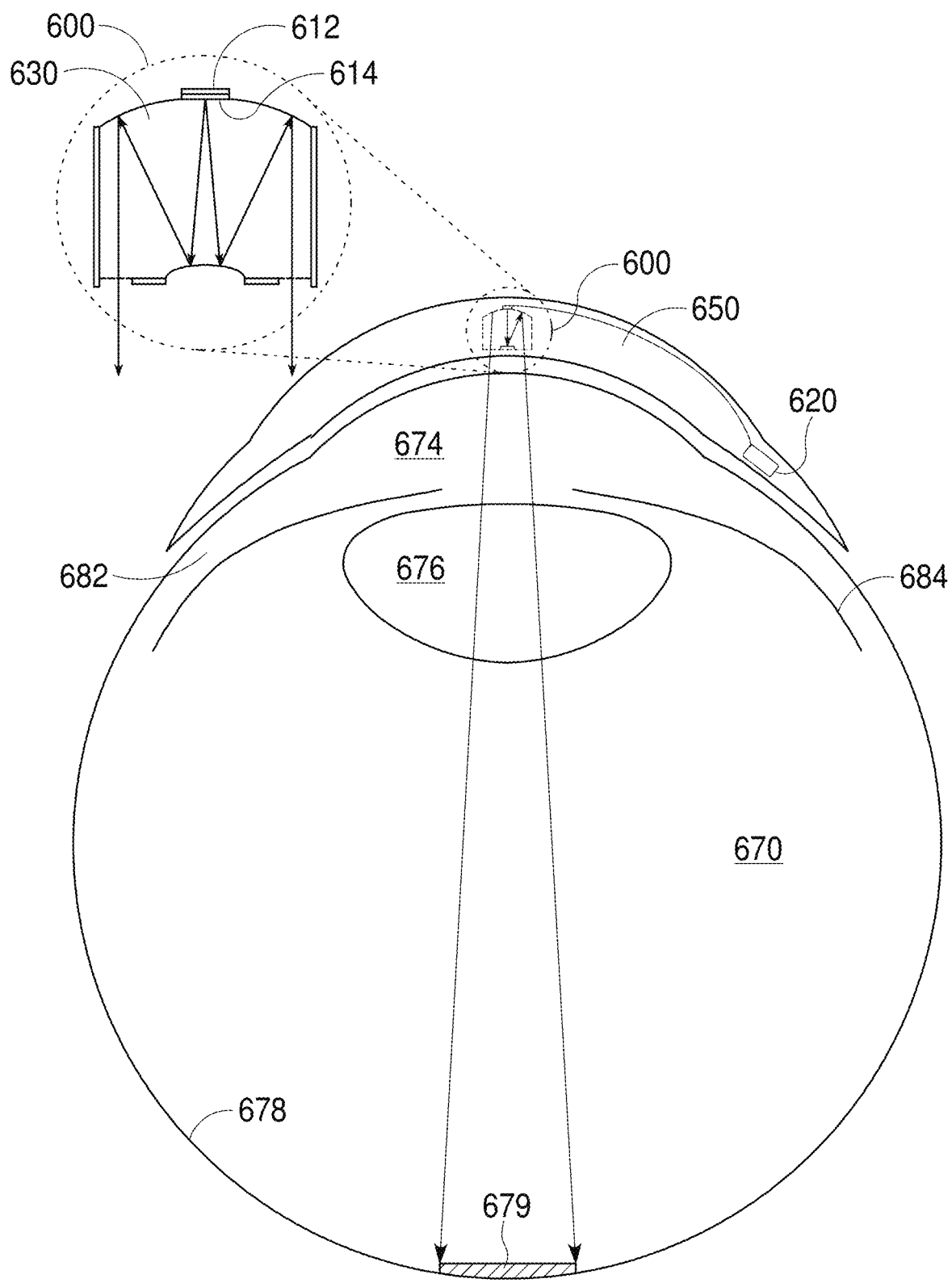
FIG. 6 shows a cross sectional view of an eye-mounted display containing a femtoprojector in a contact lens.

One possible use of a monolithic ultra-dense LED array as described above is as the image source in a contact lens-based display so that the displayed image overlays (or replaces) the wearer's view of the real world. For convenience, such a small projector is referred to as a femtoprojector. FIG. 6 shows a cross sectional view of an eye-mounted display containing a femtoprojector 600 in a contact lens 650.

FIG. 6 shows an embodiment using a scleral contact lens which may be designed so that it does not move relative to the eyeball, but the contact lens does not have to be scleral. The aqueous of the eyeball is located between the cornea 674 and the crystalline lens 676 of the eye. The vitreous fills most of the eyeball including the volume between the crystalline lens 676 and the retina 678. The iris 684 limits the aperture of the eye.

The contact lens 650 preferably has a thickness that is less than two mm, and the femtoprojector 600 preferably fits in a 2 mm by 2 mm by 2 mm or smaller volume. The contact lens 650 is comfortable to wear and maintains eye health by permitting oxygen to reach the cornea 674. The femtoprojector 600 includes an image source 612/614 and projection optics 630. The image source includes a backplane 612 and a frontplane 614, examples of which have been described above. In this example, the backplane 612 is a CMOS application specific integrated circuit (ASIC) containing pixel drivers and the frontplane 614 includes a GaN LED array, such as described above. The backplane electronics 612 receive data packets from a source external to the eye-mounted display. The backplane ASIC 612 converts the data packets to drive currents for the frontplane GaN LED array 614, which produces light that is projected by the optical system 630 to the user's retina 678.

In some designs, the optical system 630 is a two mirror system. For example, see U.S. patent application Ser. No. 15/034,761, "Advanced Optical Designs for Eye-Mounted Imaging Systems," (40785); and U.S. Pat. No. 10,353,204, "Femtoprojector Optical Systems," (37915); which are all incorporated by reference in their entireties. These optical systems 630 are small enough to fit into a contact lens and may be small enough to fit into a 2 mm×2 mm×2 mm volume, or even into a 1 mm×1 mm×1 mm volume. These designs may have a collection angle of 10 degrees to 40 degrees (5 to 20 degrees half angle), as measured in air. The collection angle will be reduced correspondingly, if measured in a medium with a higher refractive index.

The array of light emitters 614 may have non-uniform resolution. For example, the central area of the array may be imaged onto the fovea and therefore the center pixels have higher resolution (i.e., smaller pitch between pixels) compared to pixels on the periphery of the array. The pitches of the frontplane 612 and backplane 614 may be matched, in which case there is less area for each pixel driver in the center of the backplane compared to the periphery. Alternately, the backplane 614 may have a uniform pitch, where the frontplane 612 still has a variable pitch. In one approach, a wiring layer bridges between the uniform pitch backplane 614 and variable pitch frontplane 612. By using different wiring layers, the same backplane may be used with different frontplanes.

Eye-mounted femtoprojector displays may use a 200×200 array of color pixels. The display may be monochromatic or color. A three-color display with three LEDs per color pixel may have a total of at least 120,000 LEDs.

Another possible use of the monolithic ultra-dense LED display is in eyewear, such as glasses or goggles, to create an immersive visual experience or an image that overlays the wearer's view of the real world, such as in an augmented, mixed, or artificial reality application.

In many embodiments, the femtoprojector includes a frontplane and a backplane. Fig. &A is a diagram of the frontplane, which contains an LED array as described above. FIG. 7B is a diagram of the backplane, which contains the corresponding addressing and drive circuitry.

Figure 7A:
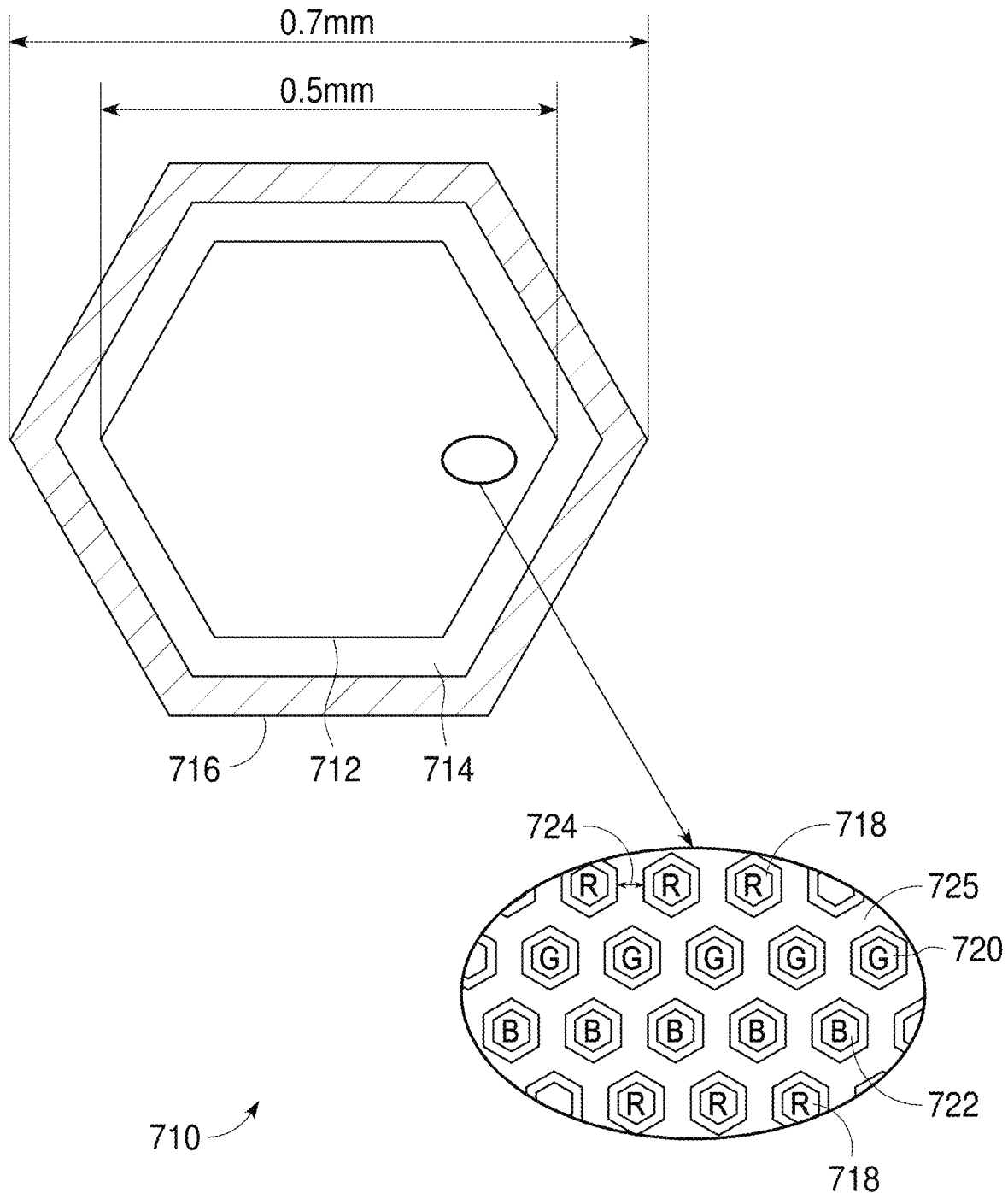
FIG. 7A shows a plan view of a frontplane for a femtoprojector, and a magnified view of a hexagonal LED array within the frontplane.
Figure 7B:
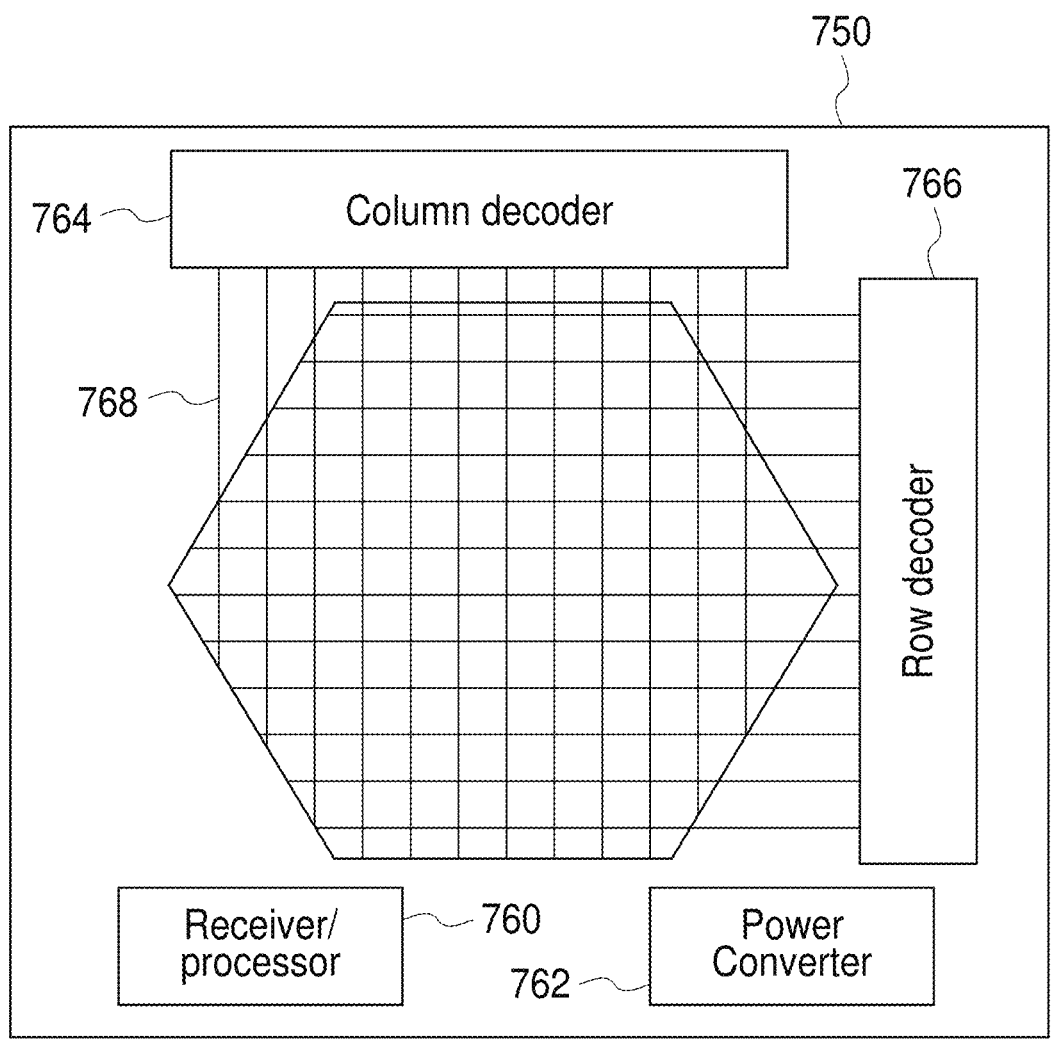
FIG. 7B shows a schematic diagram of certain circuits on a backplane for a femtoprojector.

FIG. 7A shows a plan view of a frontplane 710 for a femtoprojector, and a magnified view of the hexagonal LED array within the frontplane. The LED array within this frontplane 710 is shown as having a hexagonal shape, but other shapes are possible. A die containing the frontplane may have a rectangular shape. The dimensions in the following descriptions are also examples.

The frontplane 710 includes a central pixel area 712, a dead space area 714, and an n-ring area 716. The area 716 is a termination area to electrically connect one contact of all the LEDs in the array to a common electrical contact on the backplane. The diameter of the frontplane components shown may be about 0.7 mm, and the diameter of the pixel area 712 may be about 0.5 mm. The width of each pixel is less than 2 um and preferably about 0.6 um. In one embodiment, the display contains more than 400,000 pixels with variable sizes of pixels from a minimum of 0.6 um to a maximum of 2 um.

Also shown in FIG. 7A is an expanded view of a portion of the pixel area 712, showing red pixels (R) 718, green pixels (G) 720, and blue pixels (B) 722. In one embodiment, the LEDs are GaN-based LEDs and the active layers of the LEDs within the pixels output blue light. The red and green pixels are formed using a phosphor, quantum dots or other color-conversion mechanisms to down convert the blue pump light to longer wavelengths. The gap 724 between pixels is less than 0.5 um and preferably about 0.2 um to increase the density, fill-factor, and resolution of the display. The space 725 between the pixels is filled with a reflective metal, such as aluminum.

The die may be rectangular, even though the display portion 710 is hexagonal. The die may also contain various silicon circuitry for processing image signals, powering the device, addressing the pixels, etc.

FIG. 7B shows a schematic diagram of certain circuits on a backplane 750 for use with the femtoprojector frontplane 710 of FIG. 7A. FIG. 7B schematically illustrates one possible addressing technique used on the backplane 750 for addressing a particular pixel by applying a voltage to the associated contact for that pixel. The die may be about 0.5-1 mm wide.

Image signals may be transmitted to the backplane 750 using wireless or other means. In one embodiment, radio frequency signals (e.g., about 13 MHz) are received by an antenna and processed by a receiver/processor 760. Power for the backplane 750 may be received by the antenna via resonant inductive coupling and converted to the appropriate voltage and polarity by a power converter 762. The power signal and the image signals may be at different frequencies so that the signals can be separated. The power converter 762 and receiver/data processor 760 may be integrated into the backplane chip 750 or integrated into a separate power/data chip with the data receiver/processor 760 and the power converter 762 electrically connected to the display backplane 750 by conductors. The small size allows the femtoprojector display to be encased in a contact lens. The image signals may include addressing signals that are decoded by a column decoder 764 and a row decoder 766. Traces 768 in the device layer of the backplane 750 form an array of pixel locations. Control voltages on a selected column line and row line turn on a transistor for conducting current to the selected pixel. The color brightness may be controlled by pulse width modulation, by amplitude modulation or by other means. Low power CMOS switches may be used to address pixels. The relative brightness of the red, green, and blue pixels in a single full color pixel determines the perceived color for that composite pixel.

In an example of the display being incorporated in a contact lens, the power converter 762 and receiver/processor 760 may be separated from the backplane 750 in a separate chip, and both chips may be separately encased in the contact lens. The power/data chip is located away from the pupil so as to not obstruct vision. Small wires connect metal pads on the backplane 750 to metal pads on the power/data chip. A thin wire loop antenna is also connected to pads on the power/data chip and encased in the contact lens.

Although the detailed description contains many specifics, these should not be construed as limiting the scope of the invention but merely as illustrating different examples. It should be appreciated that the scope of the disclosure includes other embodiments not discussed in detail above. For example, the principles described above may also be applied to LED arrays in which the roles of the n- and p-layers are reversed. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. An array of semiconductor LEDs, each LED comprising:
   a gallium nitride semiconductor mesa comprising a top layer that is one of an n-layer and a p-layer, a bottom layer that is the other of an n-layer and a p-layer, and an active region between the top layer and the bottom layer; wherein the semiconductor mesa further comprises a top surface and sidewalls extending downwards and outwards from the top surface; and
   a ruthenium reflector positioned above and self-aligned to the top surface of the semiconductor mesa; wherein the sidewalls are formed by trenches etched through the ruthenium reflector, top layer and active region, and downwards into the bottom layer, with not more than 10% undercutting of a width of the ruthenium reflector;
   wherein a pitch from one LED to an adjacent LED in the array is not greater than 2 um, and a ratio of height to width for the semiconductor mesas is at least 2:1.

2. The LED array of claim 1 wherein each LED further comprises:
   a tantalum cap positioned above the ruthenium reflector.

3. The LED array of claim 1 wherein the ruthenium reflector consists entirely of ruthenium.

4. The LED array of claim 3 wherein the ruthenium reflector makes direct contact with the top surface of the semiconductor mesa.

5. The LED array of claim 3 further comprising an intermediate layer attaching the ruthenium reflector to the top surface of the semiconductor mesa, the intermediate layer comprising at least one of titanium, chromium or nickel.

6. The LED array of claim 1 wherein the ruthenium reflector covers between 10% and 75% of an area of the top surface of the semiconductor mesa.

7. The LED array of claim 1 wherein gallium from the semiconductor mesas does not intermix with the ruthenium reflector.

8. The LED array of claim 1 wherein the active region has a width of not more than 2 um, and the bottom layer comprises a thinned gallium nitride region wherein the gallium nitride region is thinned to reduce a height of the bottom layer to less than 3 um.

9. The LED array of claim 1 wherein the ruthenium reflector and top layer form a half cavity for light emitted from the active region.

10. The LED array of claim 9 wherein the half cavity redistributes light emitted from the active region into an angular power distribution with at least one lobe, and the sidewalls reflect at least one of the lobes to a direction that is closer to a central axis of the semiconductor mesa.

11. The LED array of claim 1 wherein the sidewalls are formed by trenches between adjacent LEDs that are at least partially filled by a dielectric that electrically isolates the top layers and active regions of adjacent LEDs.

12. The LED array of claim 11 wherein a top surface of the dielectric forms a flat surface for metal contacts to each of the semiconductor mesas.

13. The LED array of claim 1 wherein the sidewalls are formed by trenches between adjacent LEDs that are at least partially filled by a reflective metal fill that provides optical isolation between adjacent LEDs and electrically connects the bottom layers of adjacent LEDs.

14. The LED array of claim 1 wherein each LED further comprises:
   an oxide layer above the ruthenium reflector; and
   a metal plug through the oxide layer and contacting the ruthenium reflector.

15. The LED array of claim 1 wherein a pitch from one LED to an adjacent LED in the array is less than a height of the semiconductor mesas.

16. The LED array of claim 1 wherein the top surfaces of adjacent LEDs are separated by not more than 0.5 um.

17. The LED array of claim 1 wherein array of semiconductor LEDs form at least a 200×200 array of color pixels.

18. The LED array of claim 1 wherein the array of semiconductor LEDs is a hexagonal array.

19. The LED array of claim 1 wherein the LED array is sufficiently small to fit into a contact lens.

\* \* \* \* \*